United States Patent [19]

Nguyen et al.

[11] Patent Number: 5,781,074

[45] Date of Patent: Jul. 14, 1998

[54] LOW ELECTROMAGNETIC INTERFERENCE CLOCK OSCILLATOR MODULE

[76] Inventors: Chuong Dinh Nguyen, 708 San Conrado #2, Sunnyvale, Calif. 94086; James John Levante, 769 Lakeview Way, Redwood City, Calif. 94062

[21] Appl. No.: 689,457

[22] Filed: Aug. 9, 1996

[51] Int. Cl.[6] .................... H03B 1/04; H03B 5/32
[52] U.S. Cl. .................... 331/105; 331/78; 331/158; 331/175; 331/108 D; 327/164
[58] Field of Search ................... 331/47, 67–69, 331/78, 105, 116 R, 116 FE, 108 C, 108 D, 158, 175; 327/164

[56] References Cited

U.S. PATENT DOCUMENTS 5,302,921  4/1994  Shigemori et al. ............... 331/68 X
5,488,627  1/1996  Hardin et al. .................... 375/204

*Primary Examiner*—David Mis
*Attorney, Agent, or Firm*—Ron Fish; Falk & Fish LLP

[57] ABSTRACT

A low noise clock oscillator in modular form to plug into a standard 14 or 8 pin DIP clock oscillator socket on the motherboard of a host device to retrofit the host device without redesign of the host device motherboard so that the host device can reduce its EMC emissions sufficiently to pass EMC emission tests. The oscillator is characterized by use of a spread spectrum clock generator, EMC filters between the clock generator and the Vcc, ground and clock bus coupling points to the motherboard and a single point ground connection to the motherboard. This oscillator module allows an easy retrofit to a host device that has already been designed to substantially lower EMC emissions that can be traced to the clock by as much as 20 dB without expensive, time consuming redesign efforts to add shielding, more grounds and possibly reroute the motherboard traces.

9 Claims, 7 Drawing Sheets

LOW ELECTROMAGNETIC INTERFERENCE CLOCK OSCILLATOR MODULE

BACKGROUND OF THE INVENTION

The invention pertains to the field of electromagnetic compatibility (EMC) in digital electronic equipment that use one or more oscillators to establish clocking signals.

Digital equipment such as personal computers, printers and other devices depend for timing synchronization on clock pulses generated by a high frequency oscillator. These clock pulses have fast rise times which causes a Fourier power spectrum with many frequency compoents over a broad band with significant power levels. Many of these Fourier components are in the radio frequency bands and can radiate from the signal traces, ground planes, power cords, monitor cables etc. of the digital apparatus in which they are generated. These radiated components interfere with nearby electrical and electronic receivers such as radios and televisions.

In the United States, the FCC publishes electromagnetic interference compatibility (herafter EMC) standards which are voluntary in that manufacturers do not have to meet them to market their products in the United States. European authorities also publish EMC standards, but they are not voluntary. Under European EMC directive, unless manufacturer meets these EMC standards, the manufacturer is not allowed to sell products in the European Economic Community.

Traditional product development cycles often do not involve consultation with an EMC design engineer during design of a product. As a result, EMC design efforts to reduce emissions are often done after a product fails an EMC test. These EMC reduction efforts include adding shielding, grounding, adding EMC filters etc. Unfortunately, taking these measures after a design is already completed is expensive, and the measures which can be effectively taken are limited. For example, adding shielding, filters and more grounding is time consuming and expensive as is re-layout of a printed circuit board.

Product introduction windows to take advantage of market openings often requires fast product development cycles and rapid introduction of the product to the market for high technology products since product obsolescence occurs rapidly. Product life cycles of 3 years or less are not uncommon in the high technology business as the unrelenting pace of technology causes faster, smaller, lower power, higher capacity, more capable technologies to be constantly introduced. As a result, the time spent in re-designing products to meet tough EMC standards, can be fatal to the product's success. Re-routing traces and adding filters and grounding can add bugs to a product which need to be found and eliminated. Providing extra shielding requires time and expense to develop tooling to manufacture the new shielding parts.

Those skilled in the art appreciate that the best way to eliminate or reduce noise or electromagnetic interference (EMI) is to reduce the noise at its source. Most products which fail EMC tests fail as the result of radiation of clock signal harmonics and high frequency Fourier components of the clock signals and associated sideband noise which can also be traced to the clock oscillator.

The most significant prior art efforts to date to reduce EMI is represented by the development of the spread spectrum clock generator integrated circuits such as the IMISM530 Reduced EMC Clock Modulator Chip developed by International Microcircuits Inc. of Milpitas, Calif. and is described in U.S. Pat. No. 5,488,627, which is hereby incorporataed by reference. These chips spread clock frequencies to reduce peak EMI from system clocks and their associated harmonics and can reduce clock radiated EMI by as much as 20 dB. The data sheet for this chip is hereby incorporated by reference herein.

Accordingly, a need has arisen for an improved clock oscillator which can quickly and easily reduce radiated EMI in completed digital designs to allow them to be quickly retrofitted with a new clock oscillator such that tough EMC emission tests can be quickly and inexpensively passed without expensive, time-consuming redesigns.

SUMMARY OF THE INVENTION

According to the teachings of the invention, there is defined a genus of low EMC emission clock oscillators which has the following characteristics.

First, a EMC clock oscillator within the genus of the invention is in a plug-in modular form with its own printed circuit board so that it does not have to be designed into the main print circuit board or motherboard hereafter referred as motherboard) which may have EMC problems designed into it. The plug-in module has four long pins which extend from the underside of the module which are spaced in such a manner that the module can be plugged into industry standard 14 pin or 8 pin DIP package sockets. These are the 14 pin and 8 pin DIP package sockets into which integrated clock modules not designed with low EMC in mind are plugged. The pins of the EMC clock oscillator module are spaced so as to make connections with the proper pin receptacles in the sockets such that the low noise clock oscillator module receives power and ground connections on the proper pins and outputs clock signals on the proper pin.

Second, a low noise clock oscillator according to the genus of the invention will utiize a spread spectrum clock generator chip which is now commercially available which lowers the amplitude of the clock harmonics by spreading the spectrum of each.

Third, a low noise clock oscillator according to the genus of the invention will include its own analog and digital ground planes on the clock oscillator module which are coupled together at a single-point exactly at a single pin connection from the module to the motherboard.

Fourth, a low noise clock oscillator according to the genus of the invention will include EMC filters in series with each of the three active electrical connections between the clock oscillator module and the motherboard. These three EMC filters prevent any noise on the power supply of the host device or the ground planes of the host device from reaching the spread spectrum clock generator and being "amplified" and reduce noise components generated by the clock generator chip from reaching the motherboard clock bus where it can be further radiated.

Fifth, according to a subgenus within the broad genus defined by the first four characteristics given above, a low noise clock oscillator according to the subgenus will have the above four characteristics and will include pads or discrete components along the edge of the module connected by conductive traces which can be clipped or removed to alter the electrical characteristics of the clock oscillator. By clipping selected traces or components, the amplitudes of the clock harmonics can be reduced in small steps at the expense of slightly wider bandwidths for the Fourier spectral components of each harmonic. Further, by clipping the traces between the pads, it is possible to change the crystal frequency that is selected for output by the clock generator by changing the clock generator filter characteristics to select the desired harmonic. Thus, the output clock frequency of the low noise clock module can be altered without changing the crystal.

DETAILED DESCRIPTION OF THE PREFERRED EMBODIMENT

Figure 1:
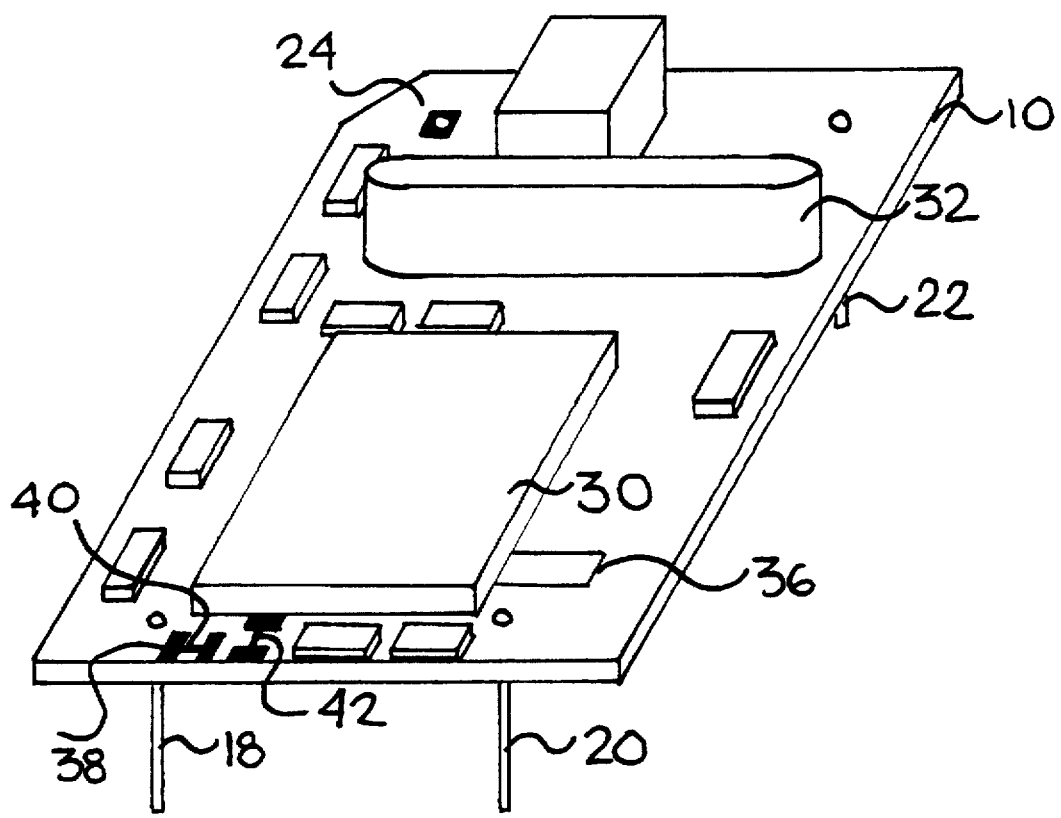
FIG. 1 is a perspective view of a clock module according to the genus of the invention.
Figure 2:
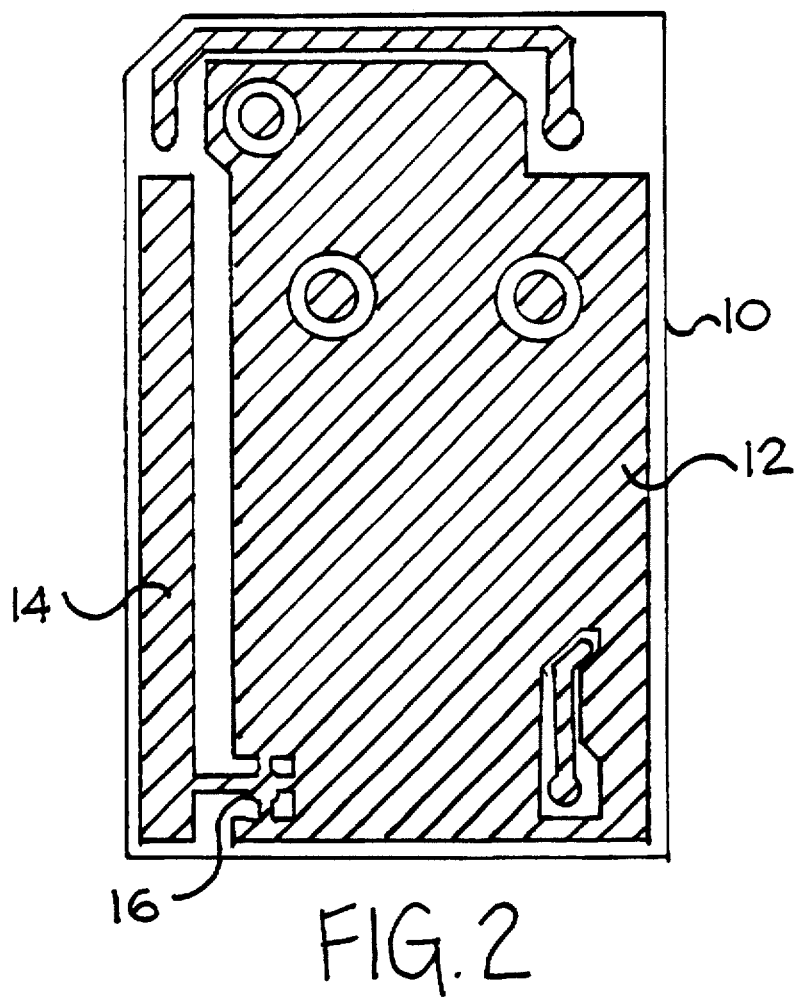
FIG. 2 is a drawing of the underside of the module showing the digital and analog ground traces and single point ground.
Figure 3:
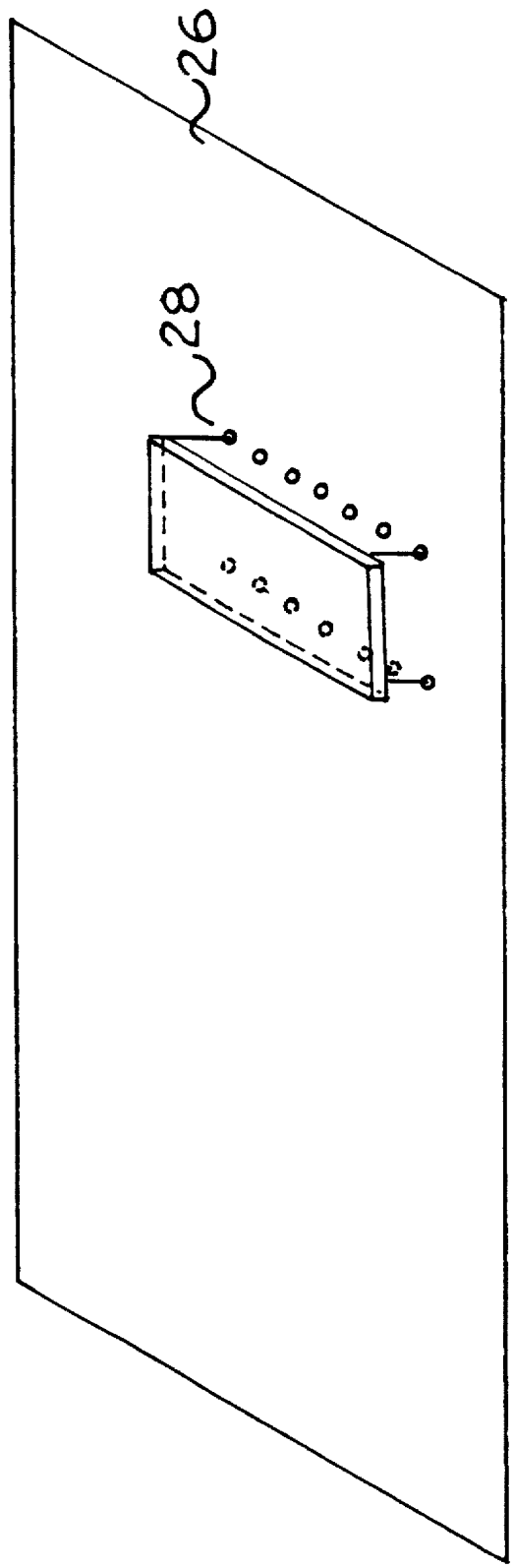
FIG. 3 is a perspective view showing how the oscillator module is mounted in a standard clock oscillator 16 pin DIP socket on the motherboard of the host with the ground plane traces of the module above the ground plane traces of the motherboard with only a single point connection.

Referring to FIG. 1, there is shown a perspective view of a low noise clock oscillator according to the genus of the invention. The clock oscillator has its own printed circuit board 10 which contains its own digital ground plane trace and analog ground plane trace (neither shown in FIG. 1 but illustrated in FIG. 2). FIG. 2 illustrates the conductive traces on the underside of the printed circuit board 10. A digital ground plane 12 and an analog ground plane 14 are physically and electrically joined together at a single conductive trace point 16 and are electrically connected to a single pin 18 shown in FIG. 1. The oscillator module has four long pins 18, 20, 22 and 24 which extend from the underside of the oscillator module. FIG. 3 illustrates how the EMC clock oscillator module is typically plugged into a digital circuit motherboard 26 of any host device. The EMC clock oscillator modulator is mechanically supported from and electrically connected to the motherboard 26 by plugging the four pins 18, 20, 22 and 24 into the pin receptacles of an industry standard 16 pin or 8 pin DIP package. When mounted, the ground plane traces of the oscillator module are above and insulated from the ground plane traces of the motherboard except for a single point connection between the motherboard ground planes and the oscillator module ground planes. The industry standard 14 (or 8 pin) pin DIP package socket, represented by two parallel lines of holes of which hole 28 is typical, is electrically coupled to the motherboard conductive traces so as to provide to conventional clock generator chips a power connection, a connection to the clock bus on the motherboard, and one or more ground connections to a motherboard digital ground plane/trace (not shown) and a motherboard analog ground plane or trace. The four pins 18, 20, 22 and 24 extending from the underside of the oscillator module are sized and spaced from each other so as to fit into the appropriate pin receptacles of the 14 or 8 pin DIP socket so as to make the same electrical connections to the power, ground and clock bus connections that a standard clock generator chip would make with the possible exception of the ground connections. A low noise clock module according to the teachings of the invention will make a ground connection between the digital and analog ground planes of the clock module to the analog and digital ground plane traces (which should be electrically connected together on the motherboad) at a single point. This has the advantage of preventing any EMI problems such as common impedance, ground loops, or eddy currents on the motherboard ground planes that are emitting noise from being coupled to the ground planes or traces of the oscillator module. If these ground loops on the motherboard ground planes were coupled to the ground planes of the EMC clock oscillator module, they could be "amplified" by injecting noise into the clock generator output signal by altering the ground reference voltage at EMC frequencies. The noise bearing output signal from the clock generator would then be coupled onto the clock bus of the motherboard which would act at radiating antennas thereby increasing EMC emissions. By coupling the ground planes of the low noise clock oscillator to the ground plane trace of the motherboard at only one point, this noise mechanism is eliminated.

Referring to FIG. 1 again, block 30 represents a commercially available spread spectrum clock generator chip. The clock generator chip is coupled to a crystal 32 which sets a fundamental frequency for the clock generator chip. The function of the clock generator chip is to reduce the amplitude of each clock harmonic by spreading the Fourier power spectrum of each harmonic thereby conserving the overall energy in each harmonic. This helps a digital product pass EMC emission tests because the tests only establish threshold amplitude levels for EMC emissions at various frequencies (the amplitude levels step down at higher frequency bands). By reducing the amplitude of each clock harmonic by spreading its spectrum, it makes it possible for some digital products to pass tough EMC emissions tests that otherwise would not pass. One advantage of the modular, plug-in replacement form factor of the EMC clock oscillator according to the teachings of the invention is that it allows the commercially available spread spectrum clock generator to be retrofitted to a host system which is not passing EMC tests without the need for any time consuming, expensive redesign of the product such as re-routing, addition of shielding, more grounding etc. If a product is failing an electromagnetic emissions test (EMI test) by only 1–2 dB, the adaptation to spread spectrum clock generator technology alone will suffice to make the product pass.

The low noise clock oscillator according to the invention also includes "switches" on the printed circuit board of the clock oscillator the states of which can be altered to alter the clock frequency output of the low noise clock oscillator. These switches take the form of conductive pads like the pads of an edge connector, of which pads 36 and 38 are typical. Certain pairs of the pads are electrically connected together by conductive traces of which traces 40 and 42 are typical, and most of the pads are coupled to the spread spectrum clock generator chip 30. By clipping selected traces, it is also possible to alter the frequency of the clock signal output by the oscillator module by altering the frequency selection passband characteristics of the internal filters in the spread spectrum clock generator chip to select different harmonics of the fundamental frequency for output.

Another important function of the "switches" is to alter the amount of spreading of the spectrum of the clock harmonics such that the amount of spreading of the harmonics can be controlled in steps. It is well documented that when a clock harmonic frequency has its spectrum spread, the amplitude of the fundamental frequency in the Fourier spectrum is decreased. The more the spectrum is spread, the more the amplitude is decreased. By cutting certain of the traces, it is possible to increase the amount of spectrum spreading in steps. Each increase in the amount of spectrum spreading, decreases the amplitude of the harmonic fundamental being spread by an additional amount. This is useful in retrofitting with EMC clock oscillators host products which are only failing EMC tests by a small amount. Although the EMC clock oscillator is capable of reducing EMC emissions by as much as 20 dB, to do so on a product that was failing an EMC test by only 4 dB would spread the spectrum of the clock harmonics more than is necessary to pass the EMC emissions test. Spreading the spectrum of clock signals too much can cause some microprocessors to fail or create intermittent errors or other faults. Therefore, it is advantageous to be able to reduce the amplitude of a clock harmonic that is exceeding the EMC threshold by only a small amount, by a number of dB which is enough to cause the host product to pass the EMC test with a comfortable margin but not more than is necessary to pass the EMC test. This minimizes or eliminates errors created elsewhere in the host digital circuitry caused by the spectrum spreading of the clock signal.

Figure 4:
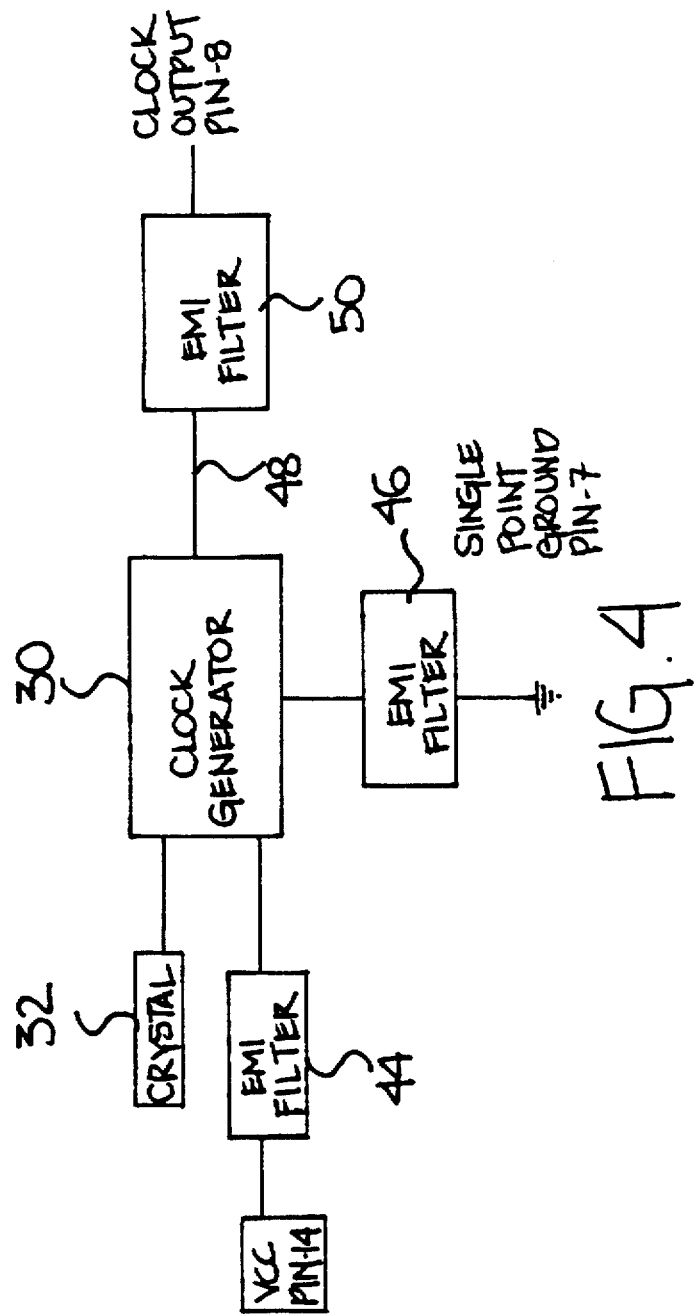
FIG. 4 is a schematic block diagram of the preferred embodiment of the oscillator showing the pin out and the use of EMC filters at every electrical point of coupling to the motherboard.

FIG. 4 is a schematic block diagram of the preferred embodiment of the oscillator showing the pin out and the use of EMC filters at every electrical point of coupling to the motherboard. The spread spectrum clock generator 30 is preferably a IMISM530 Reduced EMC Clock Modulator Chip available commercially from International Microcircuits Inc. of 525 Los Coches Street, Milpitas, Calif. The clock generator has its fundamental frequency defined by crystal, and is coupled to a Vcc power source via an EMC filter 44 and pin 14 of the standard DIP 14 pin socket. EMC filter 44 prevents any EMC noise on the Vcc supply from reaching the clock generator chip 30 and being amplified by being injected into the clock signal and coupled out onto the clock bus. The clock generator has its ground pin coupled to the module ground plane 12 and the motherboard ground plane through EMC filter 46 and a single point ground connection passing through pin 7 of the standard 14 pin DIP. EMC filter 46 prevents any ground loops or other noise on the motherboard ground plane from being coupled to the clock generator and being amplified by injection into the clock signal and coupling onto the clock bus to radiate to the EMC test receiver. The clock generator's output clock signal on line 48 is coupled through EMC filter 50 to the motherboard clock bus via pin 8 of the DIP socket.

Filter 50 suppresses any EMC noise components in the clock signal such that they do not reach the motherboard clock bus and radiate.

Figure 5A:
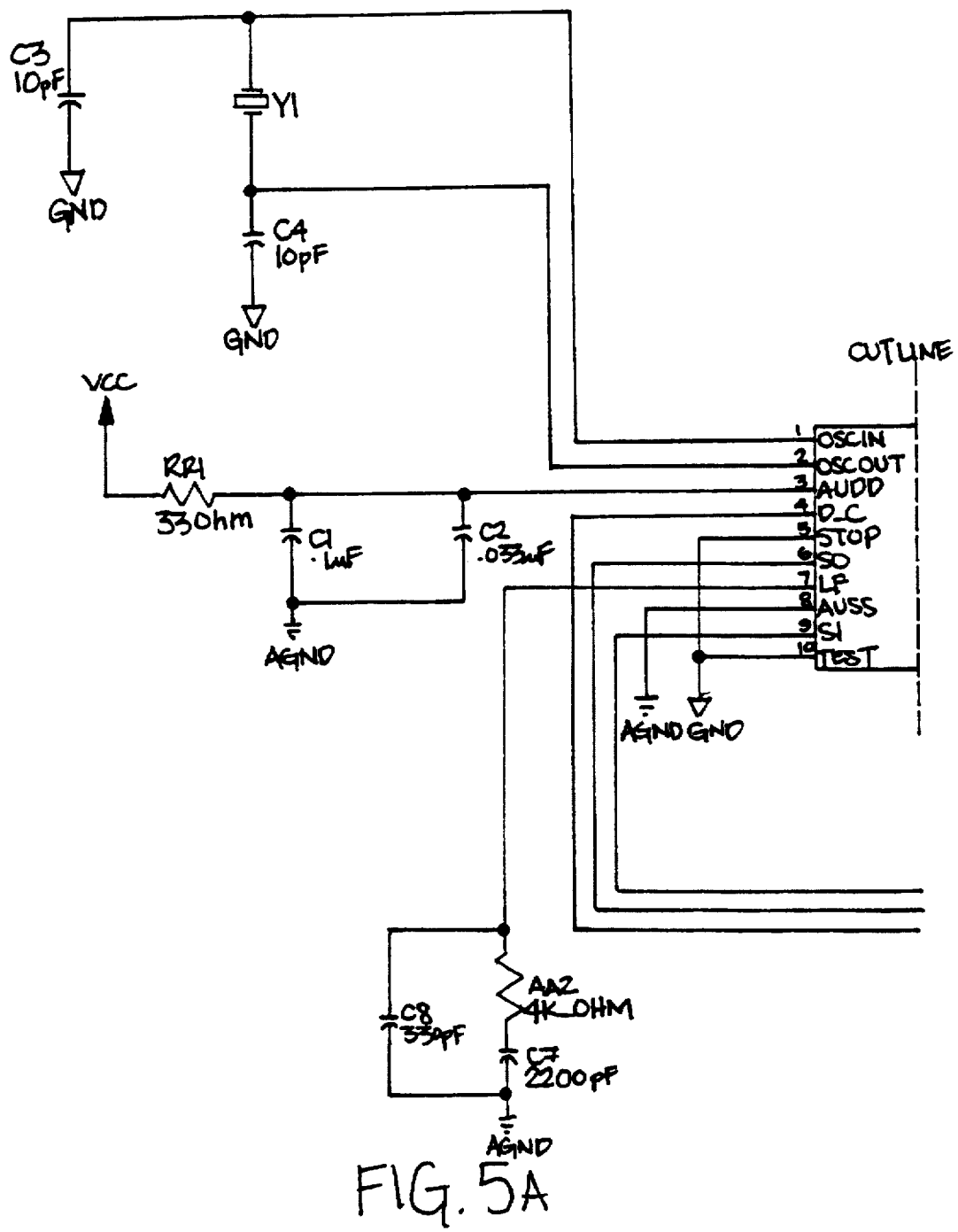
FIGS. 5A and 5B are a schematic diagram of the low noise clock oscillator module of FIG. 1.
Figure 5B:
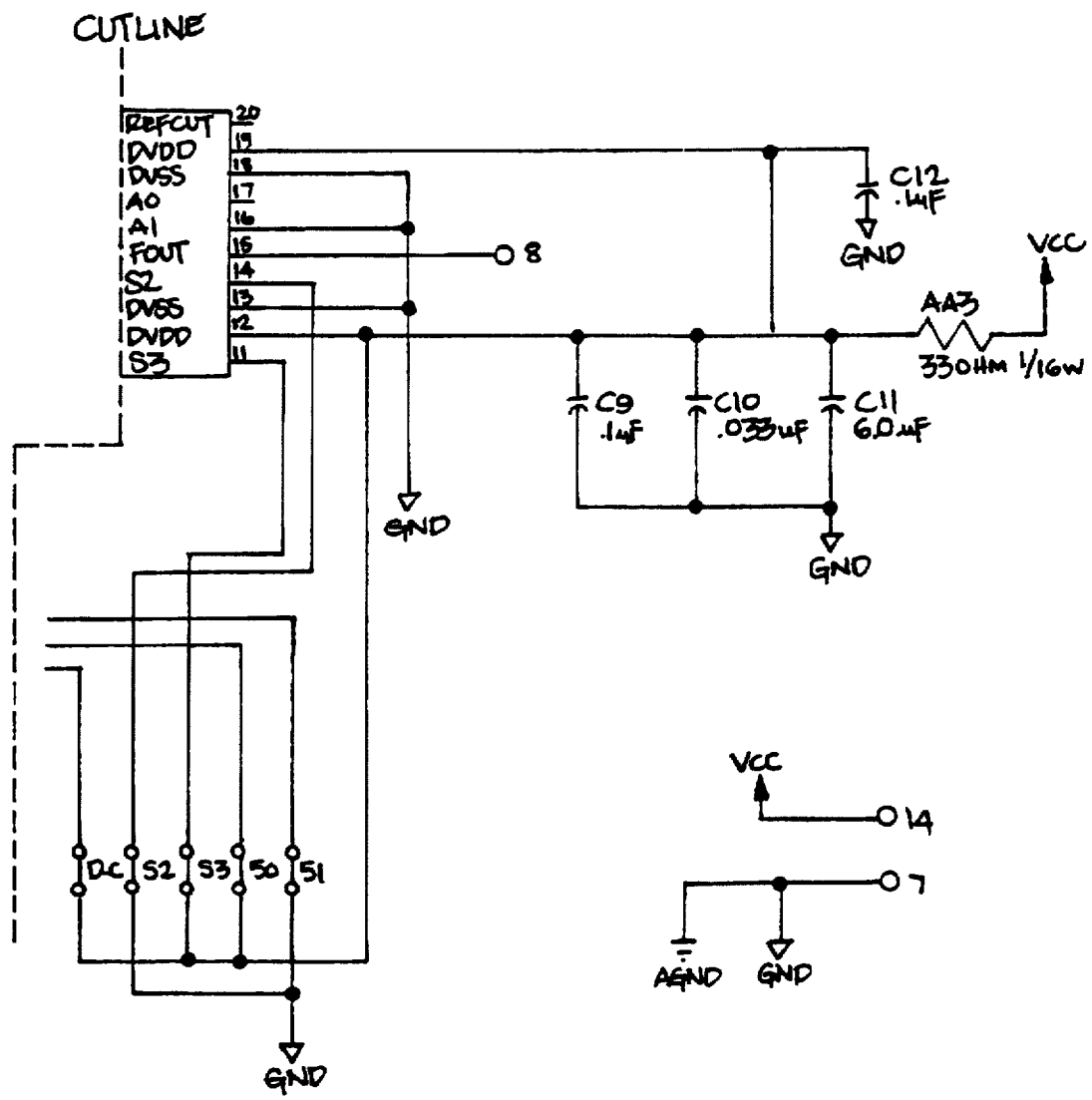

FIG. 5, comprised of FIGS. 5A and 5B, is a schematic diagram of the oscillator module shown in FIG. 1. The clock generator chip 30 can accept input frequencies from 14 to 30 MHz and the output clock frequency can be equal to a fraction of or a multiple of the input frequency, the output frequency being selectable between 14 and 120 MHz. The chip has an internal onboard oscillator the frequency of which is set by whatever crystal or other parallel resonant circuit is coupled to pins 1 and 2. The modulated output clock signal appears on pin 15 of the chip 30. Singnals S1 and S2 on pins 9 and 14 are for frequency multiplication in accordance with a chart published by the manufacturer of the chip and which is incorporated by reference herein. The LF signal is a phase detector output for the clock signal. It is a single ended, tri-state output for use as loop error signal.

The REFout signal is a buffered output of the crystal or frequency input reference. Signals S2 and S3 on pins 14 and 11 are control signals for setting the amount of spread spectrum modulation thereby allowing control of the amount of lowering of amplitude of the clock harmonics. The R1 and R0 signals on pins 16 and 17 are used to control the frequency input range. Use of the "switches" to ground or apply Vcc (logic 1) these various control pins controls operation of the clock generator chip to control the amount of modulation, the frequency input multiplier setting, and the frequency input range.

Figure 6:
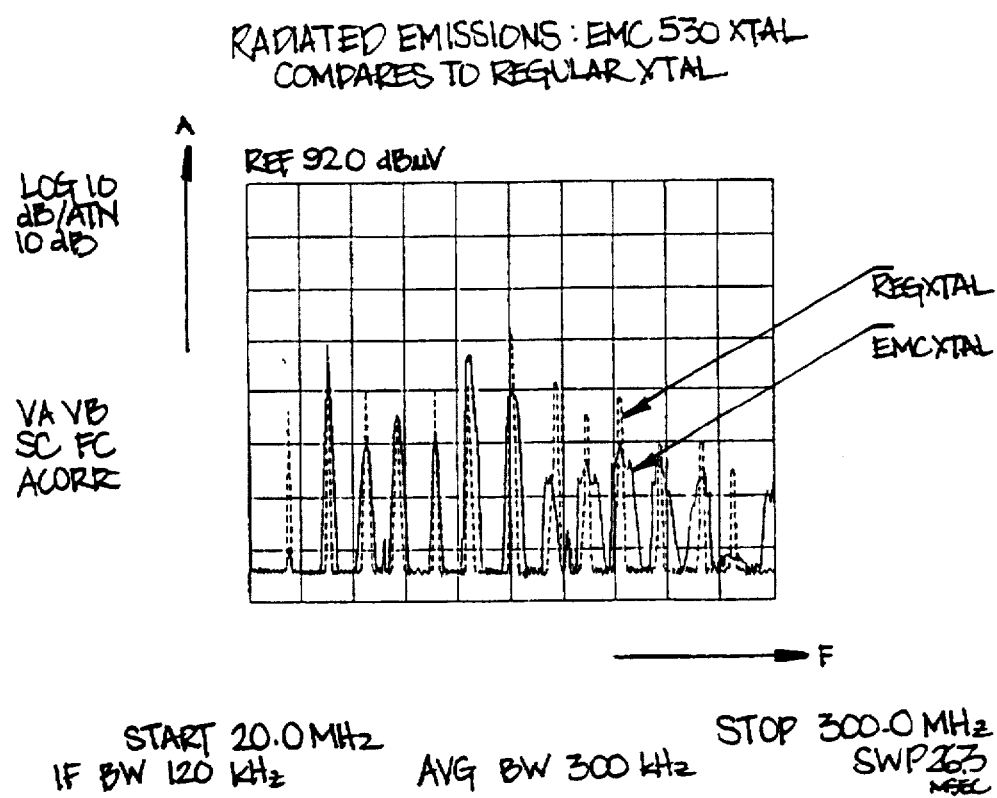
FIG. 6 shows a graph of the resulting EMC emissions of the EMC clock oscillator module of FIG. 1 with a 20 MHz input frequency as compared to a standard crystal clock oscillator.

Referring to FIG. 6, there is shown a graph of the resulting EMC emissions of the EMC clock oscillator module of FIG. 1 with a 20 MHz input frequency as compared to a standard crystal clock oscillator. The vertical axis is amplitude in dB of EMC emissions, and the horizontal axis is the frequency of the emissions. The solid lines represent the emissions of the EMC clock oscillator module while the dashed lines represent the EMC emissions at various frequencies of standard crystal oscillators.

What is claimed is:

1. A low noise clock oscillator for plugging into a standard multipin DIP clock oscillator socket on the motherboard of a host device, comprising:

a printed circuit board having a plurality of conductive traces and which is separate from the motherboard;

a spread spectrum clock generator having a plurality of terminals coupled to predetermined ones of said conductive traces for generating a spread spectrum clock signal;

a crystal coupled to predetermined ones of said conductive traces;

a plurality of pins mechanically and electrically coupled to predetermined ones of said conductive traces of said printed circuit board, said pins spaced so as to engage specific pin receptacles on said DIP clock oscillator socket on said motherboard so as to provide electrical connections to couple Vcc power source and ground source conductive traces on said motherboard to said spread spectrum clock generator and to electrically couple said spread spectrum clock signal to a clock bus on said motherboard, said pins being long enough that said electrical connections can be made with said printed circuit board above and not in contact with any conductive traces on said motherboard, said electrical connection to a ground source conductive trace on said motherboard via a single pin;

a plurality of EMC filters coupling each of said pins to predetermined terminals of said spread spectrum clock generator.

2. A low noise clock oscillator module for plugging into a standard DIP clock oscillator socket of a motherboard to replace the clock oscillator chip that normally plugs into said DIP clock oscillator socket, comprising:

a printed circuit substrate separate from said motherboard and having a ground plane;

clock generator means mounted on said substrate for generating spread spectrum clock signals from reference clock signals said clock generator means having an analog ground output coupled to analog circuitry therein and a digital ground output coupled to digital circuitry therein;

and wherein said printed circuit substrate has separate digital and analog ground plane traces thereon, said analog ground plane being connected to said analog ground output and said digital ground plane connected to said digital ground output, and wherein said printed circuit substrate has a plurality of electrical connection pins having a physical configuration and layout and electrical coupling between said clock generator means and said pins such that said clock oscillator module can be substituted for a conventional clock oscillator chip by plugging said clock oscillator module directly into the same standard DIP integrated circuit socket into which said clock oscillator chip was formerly plugged, and wherein said analog and digital ground planes are electrically connected together at the location of a ground pin which makes an electrical connection to a ground bus of said motherboard through said standard DIP integrated circuit socket.

3. The apparatus of claim 2 further comprising:

switch means coupled to said clock generator means for controlling the amount of spread spectrum modulation performed by said clock generator means on said reference clock signals in steps, and for controlling the input frequency range for said reference clock signals in discrete ranges and for controlling the amount of frequency multiplication of said clock reference signals.

4. The apparatus of claim 2 wherein said clock generator mean has a power input for receiving power for the circuit and a clock output for outputting the generated clock signal, and wherein said electrical connection pins include, in addition to said ground pin, a power source pin for coupling to a power bus on said motherboard through said integrated circuit socket, and an output pin for coupling to a clock bus on said motherboard through said integrated circuit socket, and further comprising a plurality of EMC filters mounted on said printed circuit substrate for coupling each of said power pin, said ground pin and said output pin to said power input, said ground output and said clock output of said clock generator means, respectively.

5. The apparatus of claim 2 wherein said electrical connection pins are spaced and arranged so as to be able to plug into a standard 14-pin DIP socket on said motherboard into which a conventional clock oscillator would be plugged if it were not replaced by said low noise clock oscillator module.

6. The apparatus of claim 3 wherein said electrical connection pins are spaced and arranged so as to be able to plug into a standard 8-pin DIP socket on said motherboard into which a conventional clock oscillator would be plugged if it were not replaced by said low noise clock oscillator module.

7. The apparatus of claim 4 wherein said electrical connection pins are spaced and arranged so as to be able to plug into a standard 8-pin DIP socket on said motherboard into which a conventional clock oscillator would be plugged if it were not replaced by said low noise clock oscillator module.

8. The apparatus of claim 4 wherein said electrical connection pins are spaced and arranged so as to be able to plug into a standard 14-pin DIP socket on said motherboard into which a conventional clock oscillator would be plugged if it were not replaced by said low noise clock oscillator module.

9. A low noise clock oscillator module for plugging into a standard DIP clock oscillator socket of a motherboard, comprising:

a printed circuit substrate separate from said motherboard and having a ground plane;

clock generator means mounted on said substrate for generating spread spectrum clock signals from reference clock signals;

first connection means for providing a single point electrical connection between said ground plane on said printed circuit substrate and a ground conductive trace on said motherboard and for coupling said ground plane to said clock generator means;

second connection means for providing electrical connection between a power source on said motherboard and said clock generator means and for providing electrical connection of spread spectrum clock signals generated by said clock generator means and a clock bus on said motherboard;

and further comprising:

switch means for controlling the amount of spread spectrum modulation performed by said clock generator means on said reference clock signals in steps, and for controlling the input frequency range for said reference clock signals in discrete ranges and for controlling the amount of frequency multiplication of said clock reference signals;

and further comprising a plurality of EMC filters mounted on said printed circuit substrate that couple each of said power source, said ground conductive trace and said clock bus of said motherboard to said clock generator means.

* * * * *